United States Patent [19]
Matsumoto et al.

[11] Patent Number: 5,972,526
[45] Date of Patent: Oct. 26, 1999

[54] DECORATIVE MEMBER

[75] Inventors: Yosuke Matsumoto, Noda; Yukio Tanokura; Kazumi Hamano, both of Tanashi, all of Japan

[73] Assignee: Citizen Watch Co., Ltd., Japan

[21] Appl. No.: 08/875,803

[22] PCT Filed: Dec. 7, 1995

[86] PCT No.: PCT/JP95/02506

§ 371 Date: Aug. 4, 1997

§ 102(e) Date: Aug. 4, 1997

[87] PCT Pub. No.: WO97/20970

PCT Pub. Date: Jun. 12, 1997

[51] Int. Cl.[6] .................................................. B32B 15/20
[52] U.S. Cl. ..................... 428/644; 428/670; 428/643; 428/675
[58] Field of Search ...................... 428/660, 669, 428/627, 672, 670, 674, 675, 668, 671, 935, 936, 938, 644, 643; 420/464, 497, 470

[56] References Cited

U.S. PATENT DOCUMENTS

| | | | |
|---|---|---|---|
| 4,206,268 | 6/1980 | Roemer et al. | 428/643 |
| 4,473,621 | 9/1984 | Drylie | 428/576 |
| 5,792,565 | 8/1998 | Cupolo et al. | 428/670 |

FOREIGN PATENT DOCUMENTS

| | | |
|---|---|---|
| 570989 | 3/1993 | Japan . |
| 570990 | 3/1993 | Japan . |
| 570995 | 3/1993 | Japan . |

OTHER PUBLICATIONS

Metal 64 (5) (1994). Michiyuki Kume, pp. 50–51.

XP–002062942, Database WPI, Section Ch. Week 9502, Derwent Publications Ltd., London, Great Britain, Class M13, AN 95–009790 & Japanese Laid–Open Publication No. 06 293 990 Abstract, 1 p.

Primary Examiner—Deborah Jones
Assistant Examiner—Darlene David
Attorney, Agent, or Firm—Webb Ziesenheim Logsdon Orkin & Hanson, P.C.

[57] ABSTRACT

A white decorative member comprising: a substrate; a primary plate layer having a thickness of at least 1 $\mu$m and covering the substrate, which is composed of Cu (alloy); an Sn—Cu—Pd alloy plate layer having a thickness of at least 0.2 $\mu$m and covering the primary plate layer, which comprises 10 to 20% by weight of Sn, 10 to 80% by weight of Cu and 10 to 50% by weight of Pd as essential components; and a finishing plate layer having a thickness of 0.2 to 5 $\mu$m, which is composed of at least one element selected from the group consisting of Pd, Rh and Pt. The decorative member of the present invention does not contain any Ni component, so that, when worn, it does not induce Ni allergy. Moreover, the decorative member which may have white, gold, black or multicolor being a combination of the above colors can be produced at lowered cost.

21 Claims, 4 Drawing Sheets

DECORATIVE MEMBER

THE FIELD OF INVENTION

The present invention relates to a decorative member. More particularly, the present invention is concerned with a decorative member which may have white, gold, black or multicolor being a combination of the above colors and which, when worn, does not induce Ni allergy.

BACKGROUND ART

Exterior watch parts such as wristwatch case frames, back lids and bands, ornaments such as necklaces, bracelets, pierced earrings, finger rings and earrings and spectacle frames are decorative members which are brought into direct contact with the skin when worn. Most of these decorative members have a tone such as white gloss, golden gloss or black gloss.

In the industrial manufacturing of these decorative members, the common process is employed in which a coating layer with the above tones are formed on a substrate, for example, a substrate of a metal in accordance with the wet or dry plating technique.

For example, in the manufacturing of a watch case with white gloss, the common process comprises the formation as a primary layer of a Ni plate layer having a thickness of about 2 to 3 $\mu$m on a surface of a substrate of brass or German silver and thereafter the formation as a finishing layer of a Pd—Ni alloy plate layer having a thickness of about 2 to 3 $\mu$m on the Ni plate layer, optionally followed by flash plating of Rh or Pt on the above Pd—Ni alloy plate layer.

In the manufacturing of a decorative member with golden gloss, the common process comprises the formation of a Ni plate layer having a thickness of about 2 to 3 $\mu$m on a surface of a substrate of, for example, brass or German silver, thereafter the formation of a Pd—Ni alloy plate layer having a thickness of about 2 to 3 $\mu$m on the Ni plate layer and finally the formation of a layer of, for example, 22 carat Au—Ni alloy plate or an Au plate layer having a thickness of about 1 to 2 $\mu$m on the Pd—Ni alloy plate layer. Further, a golden decorative member has been proposed which is produced by sequentially forming an Ni plate layer and then a Pd—Ni alloy plate layer on a surface of a substrate according to the wet plating technique and thereafter sequentially forming an about 0.1 to 10 $\mu$m thick TiN layer and Au or Au—Ni alloy layer in this order on the Pd—Ni alloy plate layer according to the dry plating technique such as sputtering or vacuum evaporation technique.

In the manufacturing of a decorative member with black gloss, the common process comprises the formation of about 2 to 3 $\mu$m thick Ni plate layer or Cu—Ni—Cr alloy plate layer on a surface of a substrate of, for example, brass or German silver and forming thereon an about 0.5 to 3 $\mu$m black Ni plate layer or black Cr plate layer. Further, a black decorative member has been proposed which is produced by forming the above Ni plate layer or Cu—Ni—Cr alloy plate layer on a surface of a substrate according to the wet plating technique and forming thereon a TaC layer having a thickness of about 0.1 to 2 $\mu$m according to the PVD technique such as ion plating or sputtering technique.

However, all the above conventional white, golden and black decorative members contain Ni, so that they have the danger of inducing dermatitis because the Ni may be dissolved as free Ni in, for example, the sweat excreted from the skin and brought into contact with the skin.

White, golden and black decorative members which do not contain Ni have recently been proposed for suppressing the above Ni allergization.

For example, white decorative members are known which are produced by forming a Cu plate layer or an Sn—Cu alloy plate layer containing 30 to 35% by weight of Sn in a thickness of at least 2 $\mu$m on a surface of a substrate of, for example, brass and forming thereon a finishing layer of a Pd plate layer having a thickness of about 0.1 to 5 $\mu$m. Also, white decorative members are known which are produced by forming a flash plate layer of Rh or Pt on the above Pd plate layer.

Golden decorative members are known which are produced by first forming a Cu plate layer or a plate layer of Cu alloy such as the above Sn—Cu alloy on a surface of a substrate of, for example, brass, and subsequently forming a Pd plate layer thereon and thereafter forming an Au plate layer or a plate layer of Au alloy not containing Ni, such as Au—Fe alloy, on the Pd plate layer.

Also, golden decorative members are known which are produced by sequentially forming an about 0.1 to 10 $\mu$m thick TiN layer and a layer of Au per se or Au alloy not containing Ni in this order on the above Pd plate layer according to the dry plating technique.

Black decorative members not containing any Ni component are known which are produced by forming the above TaC layer directly on the above Pd plate layer according to the dry plating technique.

All the above decorative members do not contain any Ni component, so that, when worn so as to be brought into contact with the skin, they do not induce Ni allergy.

However, these decorative members, without exception, form a plate layer from Pd which is an expensive noble metal, so that the product cost thereof is inevitably very high.

Thus, efforts are being made to use a plate layer of Pd alloy in place of the plate layer of Pd per se for reducing the relative content of Pd in the plate layer to thereby lower the whole product cost thereof.

A known example of the above plate layer of Pd alloy is a plate layer of Sn—Cu—Pd alloy. However, this plate layer of Sn—Cu—Pd alloy is unsatisfactory in the reduction of product cost because the Pd content thereof is as conspicuously high as about 50 to 99% by weight.

In the above situation, the inventors made investigations on Sn—Cu—Pd alloy plate layers having a low Pd content and developed a method of plating an Sn—Cu—Pd ternary alloy composed of 10 to 20% by weight of Sn, 10 to 80% by weight of Cu and 10 to 50% by weight of Pd and a plating bath for use in this method. These are described in Japanese Patent Application No. 5(1993)-80844.

The Sn—Cu—Pd alloy plate layer proposed therein has a low density as compared with that of a plate layer of pure Pd and, for example, when compared in plate layers of the same thicknesses, the Sn—Cu—Pd alloy plate layer has its Pd content reduced by about 60%, so that the product cost can be lowered. The Sn—Cu—Pd alloy plate layer has excellent corrosion resistance and is furnished with excellent specular gloss.

The object of the present invention is to provide a decorative member which may have white, gold, black or a multicolor combination of the above colors and which does not induce Ni allergy and can be produced at lowered cost, by utilizing the above excellent properties of the Sn—Cu—Pd alloy plate layer.

DISCLOSURE OF THE INVENTION

The white decorative member of the present invention comprises a substrate; a primary plate layer having a thickness of at least 1 μm and covering a surface of the substrate, the above primary plate layer being composed of a Cu plate layer or Cu alloy plate layer; an Sn—Cu—Pd alloy plate layer having a thickness of at least 0.2 μm and covering a surface of the primary plate layer, the above Sn—Cu—Pd alloy plate layer comprising 10 to 20% by weight of Sn, 10 to 80% by weight of Cu and 10 to 50% by weight of Pd as essential components; and a finishing plate layer having a thickness of 0.2 to 5 μm and covering the Sn—Cu—Pd alloy plate layer, the above finishing plate layer being composed of at least one element selected from the group consisting of Pd, Rh and Pt.

The golden decorative member of the present invention (hereinafter referred to as "the first golden decorative member") comprises a substrate; a primary plate layer having a thickness of at least 1 μm and covering a surface of the substrate, the above primary plate layer being composed of a Cu plate layer or Cu alloy plate layer; an Sn—Cu—Pd alloy plate layer having a thickness of at least 0.2 μm and covering a surface of the primary plate layer, the above Sn—Cu—Pd alloy plate layer comprising 10 to 20% by weight of Sn, 10 to 80% by weight of Cu and 10 to 50% by weight of Pd as essential components; and a finishing plate layer having a thickness of 0.2 to 5 μm and covering the Sn—Cu—Pd alloy plate layer, the above finishing plate layer being composed of an Au plate layer or an Au alloy plate layer which does not contain Ni.

The golden decorative member of the present invention (hereinafter referred to as "the second golden decorative member") comprises a substrate; a primary plate layer having a thickness of at least 1 μm and covering a surface of the substrate, the above primary plate layer being composed of a Cu plate layer or Cu alloy plate layer; an Sn—Cu—Pd alloy plate layer having a thickness of at least 0.2 μm and covering a surface of the primary plate layer, the above Sn—Cu—Pd alloy plate layer comprising 10 to 20% by weight of Sn, 10 to 80% by weight of Cu and 10 to 50% by weight of Pd as essential components; a TiN layer having a thickness of 0.1 to 10 μm and covering a surface of the Sn—Cu—Pd alloy plate layer; and a finishing plate layer having a thickness of 0.05 to 0.5 μm and covering the TiN layer, the above finishing layer being composed of Au alone or an Au alloy which does not contain Ni.

The black decorative member of the present invention comprises a substrate; a primary plate layer having a thickness of at least 1 μm and covering a surface of the substrate, the above primary plate layer being composed of a Cu plate layer or Cu alloy plate layer; an Sn—Cu—Pd alloy plate layer having a thickness of at least 0.2 μm and covering a surface of the primary plate layer, the above Sn—Cu—Pd alloy plate layer comprising 10 to 20% by weight of Sn, 10 to 80% by weight of Cu and 10 to 50% by weight of Pd as essential components; a Ti layer having a thickness of 0.2 to 10 μm and covering a surface of the Sn—Cu—Pd alloy plate layer; and a finishing layer having a thickness of 0.5 to 2.0 μm and covering the Ti layer, the above finishing layer being composed of TiNCO.

The multicolored decorative member of the present invention comprises a substrate; a primary plate layer having a thickness of at least 1 μm and covering a surface of the substrate, the above primary plate layer being composed of a Cu plate layer or Cu alloy plate layer; an Sn—Cu—Pd alloy plate layer having a thickness of at least 0.2 μm and covering a surface of the primary plate layer, the above Sn—Cu—Pd alloy plate layer comprising 10 to 20% by weight of Sn, 10 to 80% by weight of Cu and 10 to 50% by weight of Pd as essential components; a finishing layer having a thickness of 0.2 to 5.0 μm and covering a surface of the Sn—Cu—Pd alloy plate layer, the above finishing layer being composed of a material selected from the group consisting of Pd, Rh, Pt, Au, an Au alloy and TiNCO; and a partial finishing layer covering part of a surface of the finishing layer, the above partial finishing layer being composed of a material which is different from that of the finishing layer and having a tone which is different from that of the finishing layer.

In the decorative members of the present invention, none of the constituent materials thereof contains Ni, so that they do not suffer from dissolution of free Ni and that, when worn so as to be brought into contact with the skin, the decorative members do not induce Ni allergy.

Figure 1:
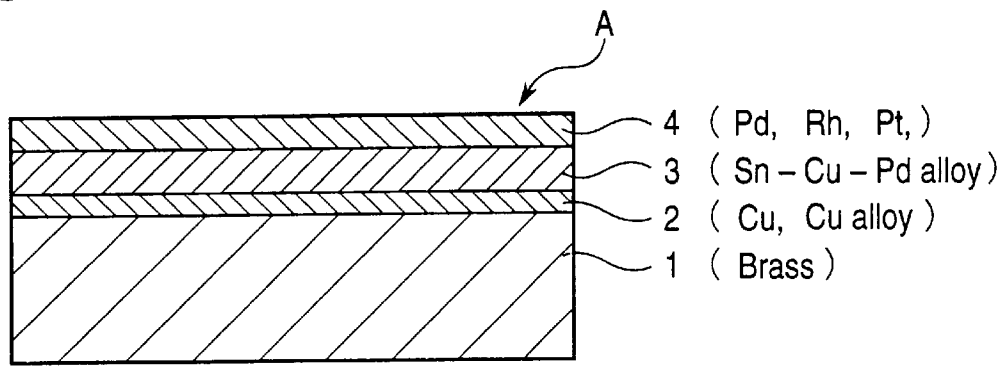
FIG. 1 is a sectional view of the layer structure of white decorative member A according to the present invention.

In the figures, numeral 1 denotes a substrate (brass), numeral 2 a primary plate layer (Cu or Cu alloy), numeral 3 an Sn—Cu—Pd alloy plate layer, numeral 4 a finishing plate layer (Pd, Rh or Pt), numeral 5 a finishing plate layer (Au or Au alloy), numeral 6 a Pd plate layer, numeral 7 a TiN layer formed according to the dry plating technique, numeral 8 a finishing layer of Au or Au alloy formed according to the dry plating technique, numeral 9 a Ti layer formed according to the dry plating technique, numeral 10 a finishing layer of TiNCO formed according to the dry plating technique, and numeral 11 a pattern mask.

BEST MODE FOR CARRYING OUT THE INVENTION

First, the white decorative member A of the present invention will be described with reference to FIG. 1.

Referring to FIG. 1, the substrate 1 consists of brass, and a surface of this substrate 1 is covered by a primary plate layer 2 having a thickness of at least 1 $\mu$m, which is composed of a Cu plate layer or Cu alloy plate layer. The primary plate layer 2 has a function of ensuring the adhesion between the surface of the substrate 1 and the below described Sn—Cu—Pd alloy plate layer to thereby prevent peeling of the plate coating and improves the gloss of the substrate by virtue of the leveling property of the contained Cu. This primary plate layer 2 is formed by the wet plating technique.

The material of the substrate 1 is not limited to brass. It may be, for example, copper, a copper alloy (e.g., red brass or phosphor bronze), zinc or a zinc alloy (e.g., Zn—Al alloy or Zn—Al—Cu alloy).

When the thickness of the primary plate layer 2 is smaller than 1 $\mu$m, a brittle intermetallic compound is formed between the primary plate layer 2 and the substrate 1 (brass) at the time of the wet plating, so that the adhesion between the primary plate layer 2 and the surface of the substrate 1 is lowered. On the other hand, when the above thickness is too large, not only is it of no use for the primary plate layer, but also a plate strain is accumulated to an extreme extent with the result that a peeling phenomenon would be encountered. The thickness of this primary plate layer 2 is preferred to range from 1 to 5 $\mu$m.

When the primary plate layer 2 is formed of a Cu alloy, for example, Cu—Sn alloy, Cu—Sn—Zn alloy, Cu—Sn—Pb alloy or Cu—Sn—Cd alloy can be used as the Cu alloy. Of these, Cu—Sn—Zn alloy comprising 20 to 40% by weight of Sn, 1 to 10% by weight of Zn and a balance of Cu can preferably be used.

When the substrate 1 is composed of brass, the primary plate layer 2 formed of the above Cu alloy enables desirable adhesion between the substrate 1 and the below described Sn—Cu—Pd alloy plate layer because the primary plate layer 2 has high affinity with the Zn component of the substrate 1 and with the Sn component of the Sn—Cu—Pd alloy plate layer.

In this structure, when the Sn content of the Cu alloy is lower than 20% by weight, the primary plate layer has poor corrosion resistance. On the other hand, when the Sn content is larger than 40% by weight, the primary plate layer 2 has intense strain, so that it has a greater tendency to be peeled from the surface of the substrate 1. When it is attempted to produce a primary plate layer composed of a Cu alloy whose Zn content is lower than 1% by weight, the Zn content of the plating bath composition is so low that the effect of lessening a difference between Cu and Sn deposition potentials at the time of plating is weakened with the result that realizing desirable gloss becomes difficult during low current operation or high current operation. Further, when the Zn content of the Cu alloy exceeds 10% by weight, the primary plate layer has poor corrosion resistance. When it is attempted to produce a primary plate layer whose Zn content exceeds 10% by weight, the amount of Cu precipitated at the time of plating becomes large thereby unfavorably rendering the entirety of the primary plate layer yellowish.

The above alloy composition can be easily realized by regulating the composition of the bath employed in the wet plating.

Subsequently, the Sn—Cu—Pd alloy plate layer 3 is formed on the surface of this primary plate layer 2 according to the wet plating technique.

This Sn—Cu—Pd alloy plate layer 3 is formed by the method described in Japanese Patent Application No. 5(1993)-80844 and the composition thereof comprises 10 to 20% by weight of Sn, 10 to 80% by weight of Cu and 10 to 50% by weight of Pd as essential components.

When the Sn content of the above Sn—Cu—Pd alloy plate layer is lower than 10% by weight, not only is the surface gloss of the Sn—Cu—Pd alloy plate layer deteriorated but also the corrosion resistance thereof becomes poor. The surface gloss of the Sn—Cu—Pd alloy plate layer 3 is also poor when the Sn content thereof exceeds 20% by weight. Thus, the Sn content is set to fall in the above range. It is preferred that this Sn content of the Sn—Cu—Pd alloy plate layer 3 range from 13 to 19% by weight, especially, 16 to 18% by weight.

When the Cu content is lower than 10% by weight, the Sn—Cu—Pd alloy plate layer 3 has poor surface gloss. The surface gloss is also poor when the Cu content of the Sn—Cu—Pd alloy plate layer exceeds 80% by weight. Furthermore, the Cu content exceeds 80% by weight, the corrosion resistance of the plate layer is deteriorated. Therefore, the Cu content is set to fall in the above range. It is preferred that the Cu content of the Sn—Cu—Pd alloy plate layer 3 range from 35 to 65% by weight, especially, 43 to 45% by weight.

When the Pd content is lower than 10% by weight, the Sn—Cu—Pd alloy plate layer 3 has poor surface gloss. The surface gloss is also poor when the Pd content of the Sn—Cu—Pd alloy plate layer exceeds 50% by weight. Furthermore, the Pd content exceeds 50% by weight, not only is the corrosion resistance of the plate layer deteriorated but also the product cost is increased. Therefore, the Pd content is set to fall in the above range. It is preferred that the Pd content of the Sn—Cu—Pd alloy plate layer 3 range from 25 to 45% by weight, especially, 37 to 40% by weight.

In particular, an Sn—Cu—Pd alloy plate layer comprising 16 to 18% by weight of Sn, 43 to 45% by weight of Cu and 37 to 40% by weight of Pd is highly advantageous in that the content of expensive Pd in the plate layer is so low that the product cost can be reduced, that the surface gloss and corrosion resistance are excellent, that the effect of enhancing the adhesion between the above primary plate layer 2 and the below described finishing plate layer is striking and that the heat resistance is high.

The thickness of this Sn—Cu—Pd alloy plate layer 3 is set at 0.2 $\mu$m or greater. The reason is that, when this thickness is smaller than 0.2 $\mu$m, zones of poor throwing power occur at the time of plating and at those zones the corrosion resistance is deteriorated. This Sn—Cu—Pd alloy plate layer 3 is preferred to have a thickness of 0.2 to 10 $\mu$m.

Finally, the finishing plate layer 4 composed of one or at least two elements selected from the group consisting of Pd, Rh and Pt is formed so as to cover the surface of the Sn—Cu—Pd alloy plate layer 3 according to the wet plating technique, thereby obtaining the white decorative member A of the present invention.

The thickness of this finishing plate layer 4 is set at 0.2 to 5 $\mu$m. The reason is that, when this thickness is smaller than 0.2 $\mu$m, the tone of white gloss as a decorative member becomes defective and that, when the thickness is larger than 5 $\mu$m, the improvement of tone reaches saturation and only the wasting of the expensive noble metal is invited to thereby incur an increase of product cost. From the viewpoint of securing the tone of economically desirable white gloss, it is preferred that the thickness of the finishing plate layer 4 range from 0.2 to 3 $\mu$m.

The thickness of this finishing plate layer 4 can be reduced by causing the above Sn—Cu—Pd alloy plate layer 3 to have a thickness as relatively large as 4 to 5 μm with the result that desirable white gloss tone can be developed on the surface thereof. Thus, economic advantage is attained.

In this white decorative member A, none of the substrate 1 and individual plate layers contains Ni, so that, when brought into contact with the sweat excreted from the skin, the white decorative member A does not suffer from dissolution of free Ni and does not induce Ni allergy. The Sn—Cu—Pd alloy plate layer 3 in its entirety is endowed with white gloss and has excellent corrosion resistance. Therefore, for example, even if the outermost finishing plate layer 4 is damaged, the decorative member A can continue to exhibit white gloss tone on its surface for a prolonged period of time.

The hardness (Hv) of the Sn—Cu—Pd alloy plate layer 3 is as high as about 250 to 350, so that, for example, even if the finishing plate layer 4 is damaged, the damaging of the substrate 1 thereby can effectively be checked.

Now, the first golden decorative member B of the present invention will be described referring to FIG. 2.

This golden decorative member B has the same layer structure as that of the white decorative member A, except that the finishing plate layer 4 of the white decorative member A as shown in FIG. 1 is replaced by a finishing plate layer 5 with golden gloss which is composed of an Au plate layer or an Au alloy plate layer not containing Ni.

The above finishing plate layer 5 is formed according to the wet plating technique, and the thickness thereof is set at 0.2 to 5 μm.

The reason is that, when the thickness of the finishing plate layer 5 is smaller than 0.2 μm, the white tone of the Sn—Cu—Pd alloy plate layer 3 positioned as a sublayer is exposed to thereby cause the tone of golden gloss as a golden decorative member to become defective and that, when the thickness is larger than 5 μm, the improvement of golden gloss tone reaches saturation and only the wasting of the expensive Au is caused thereby incurring an increase of product cost.

When this finishing plate layer 5 is formed of an Au alloy, for example, Au—Fe, Au—Pd, Au—Pt, Au—Sn, Au—Ag, Au—In, Au—Cu, Au—Pd—Fe and Au—In—Fe alloys which do not contain Ni are employed as the Au alloy.

Figure 3:
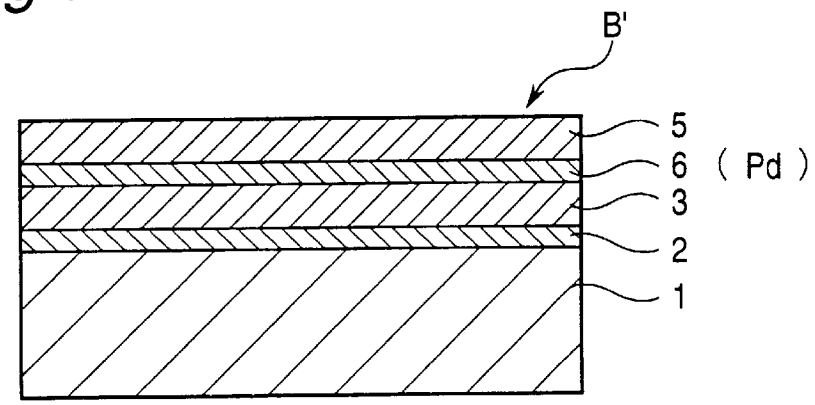
FIG. 3 is a sectional view of the layer structure of another golden decorative member B' according to the present invention.

This golden decorative member may have a layer structure B' in which a Pd plate layer 6 is interposed between the Sn—Cu—Pd alloy plate layer 3 and the finishing plate layer 5 according to the wet plating technique, as shown in FIG. 3.

Figure 2:
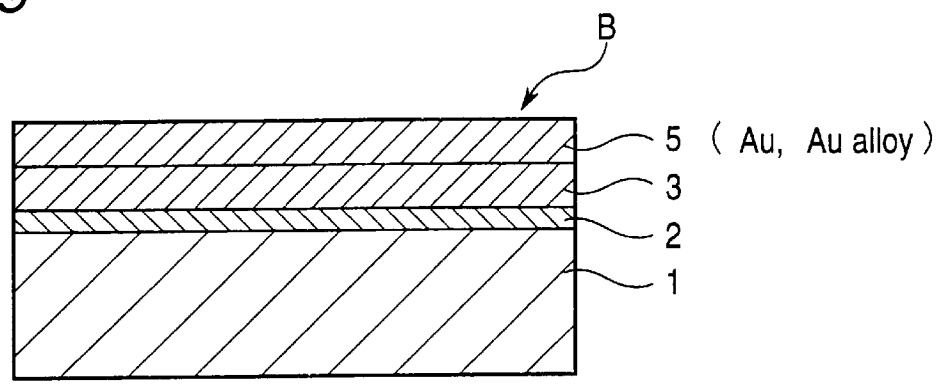
FIG. 2 is a sectional view of the layer structure of golden decorative member B according to the present invention.

This layer structure B' is desirable because the adhesion between the Sn—Cu—Pd alloy plate layer 3 and the finishing plate layer 5 is enhanced as compared with that of the layer structure of FIG. 2.

When the thickness of the Pd plate layer 6 is too large, an increased product cost is invited. On the other hand, when the thickness is too small, the above effect of enhancing the adhesion cannot be fully exerted. The thickness of the Pd plate layer 6 is preferred to range from 0.2 to 1 μm.

The second golden decorative member C of the present invention will be described below referring to FIG. 4.

This golden decorative member C has the same layer structure as that of the golden decorative member B, except that the golden finishing plate layer 5 of the golden decorative member B as shown in FIG. 2 is replaced by a finishing layer 8 composed of Au per se or an Au alloy not containing Ni and that a TiN layer 7 formed according to the dry plating technique is interposed between this finishing layer 8 and the Sn—Cu—Pd alloy plate layer 3.

This TiN layer 7 has golden gloss and has excellent abrasion resistance, so that, even when the finishing layer 8 formed on the TiN layer 7 is worn to thereby disenable the exhibition of golden gloss, the TiN layer 7 instead exhibits golden gloss to thereby play the role of securing the function of the golden decorative member for a prolonged period of time. Further, even if the thickness of the finishing layer 8 composed of Au per se or an Au alloy is drastically cut, the resultant decorative member can secure golden ornamentation on its surface to thereby enable reduction of the product cost.

The thickness of this TiN layer 7 is set at 0.1 to 10 μm. When this thickness is smaller than 0.1 μm, satisfactory abrasion resistance cannot be retained with the result that the white gloss of the Sn—Cu—Pd alloy plate layer 3 positioned thereunder is exposed within a short period of time. On the other hand, when this thickness is larger than 10 μm, the TiN layer 7 per se suffers from clouding with the result that not only is the appearance thereof deteriorated but also an increase of the product cost is invited. The thickness of this TiN layer 7 is preferred to range from 0.2 to 0.3 μm.

The thickness of the finishing layer 8 formed on the TiN layer 7 is set at 0.05 to 0.5 μm. When this thickness is smaller than 0.05 μm, the throwing power is so unsatisfactory that the TiN layer 7 as a sublayer is exposed. On the other hand, when the thickness is larger than 0.5 μm, the improvement of golden gloss tone reaches saturation and only the wasting of the expensive Au is invited. The thickness of the finishing layer 8 is preferred to range from 0.2 to 0.3 μm.

Both the TiN layer 7 and the finishing layer 8 are formed according to the conventional dry plating technique. The dry plating technique suitably employed is, for example, the sputtering, ion plating or vacuum evaporation technique.

In this golden decorative member C, none of the constituent members contains Ni, so that dissolution of free Ni does not occur at all when the golden decorative member C is brought into contact with the sweat excreted from the skin and no persons who wear it suffer from Ni allergy.

When the soft finishing layer 8 is abraded by the wear of the golden decorative member C to thereby cause the golden gloss of the finishing layer 8 to disappear, the highly abrasion resistant TiN layer 7 positioned thereunder can continue to exhibit golden gloss for a prolonged period of time.

Further, even when the finishing layer 8 and the TiN layer 7 are damaged to thereby cause, for example, the sweat excreted from the skin to penetrate into the golden decorative member C, the corrosion resistance of the golden decorative member C is secured for a prolonged period of time because of the excellent corrosion resistance of the Sn—Cu—Pd alloy plate layer 3 positioned thereunder.

Figure 5:
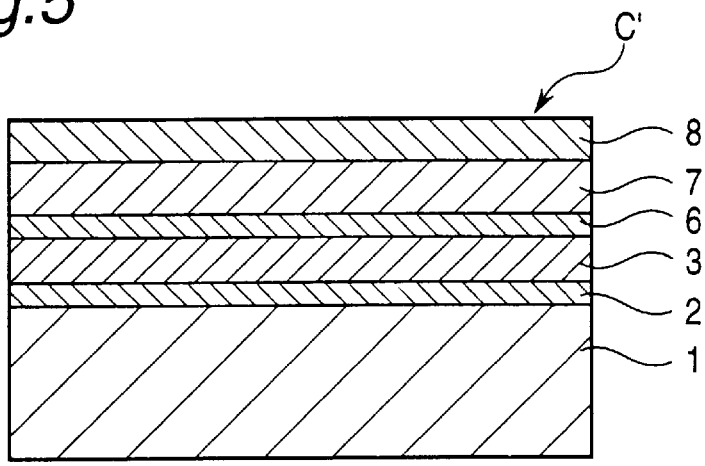
FIG. 5 is a sectional view of the layer structure of still a further other golden decorative member C' according to the present invention.

This golden decorative member may have a layer structure C' in which a Pd plate layer 6 is interposed between the Sn—Cu—Pd alloy plate layer 3 and the TiN layer 7 according to the wet plating technique, as shown in FIG. 5.

Figure 4:
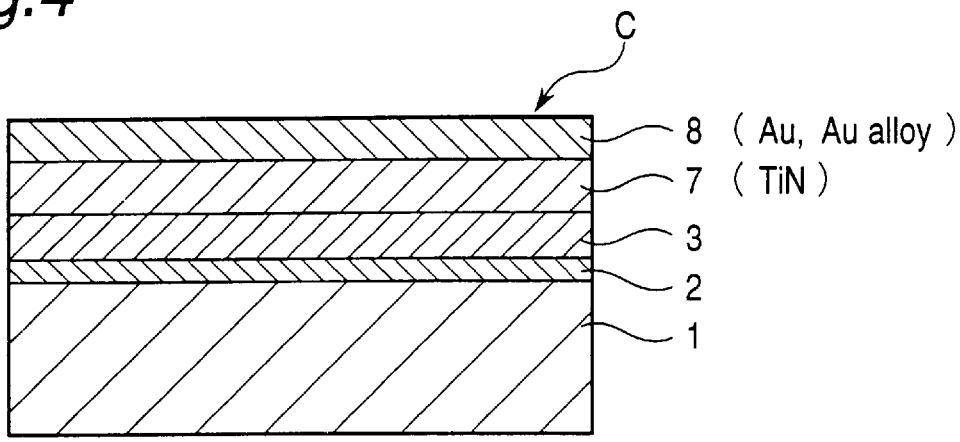
FIG. 4 is a sectional view of the layer structure of a further other golden decorative member C according to the present invention.

This layer structure C' is desirable because the adhesion between the Sn—Cu—Pd alloy plate layer 3 and the TiN layer 7 is enhanced as compared with that of the layer structure of FIG. 4.

When the thickness of the Pd plate layer 6 is too large, an increase of product cost is invited. On the other hand, when the thickness is too small, the above effect of enhancing the adhesion cannot be fully exerted. The thickness of the Pd plate layer 6 is preferred to range from 0.2 to 1 μm.

The black golden decorative member D of the present invention will be described below referring to FIG. 6.

This black decorative member D has the same layer structure as that of the white decorative member A shown in FIG. 1, except that the finishing plate layer 4 of the white decorative member A is replaced by a finishing layer 10 of TiNCO formed according to the dry plating technique and that a Ti layer 9 formed according to the dry plating technique is interposed between the finishing layer 10 and the Sn—Cu—Pd alloy plate layer 3.

The finishing layer 10 has black gloss and the hardness (Hv) thereof ranges from 1000 to 1500. The abrasion resistance of the finishing layer 10 is so high that the function of the black decorative member can be continued to secure for a prolonged period of time.

The Ti layer 9 formed under the finishing layer 10 is capable of firmly bonding the finishing layer 10 to the Sn—Cu—Pd alloy plate layer 3. Because of the interposition of this Ti layer 9, the black decorative member D is completely free from the problem of peeling of the black finishing layer 10 from the Sn—Cu—Pd alloy plate layer 3.

As long as carried under ordinary conditions, the black decorative member D is free from the problem of peeling of the finishing layer 10 even in the absence of the Ti layer 9, that is, even when the finishing layer 10 is directly formed on the Sn—Cu—Pd alloy plate layer 3.

The thickness of this finishing layer 10 is set at 0.5 to 2.0 $\mu$m. When this thickness is smaller than 0.5 $\mu$m, the finishing layer 10 is affected by the tone of the Ti layer 9 and Sn—Cu—Pd alloy plate layer 3 (both white) positioned thereunder to thereby render obtaining fair black gloss difficult. On the other hand, when the thickness of the finishing layer 10 is larger than 2.0 $\mu$m, the strain accumulation is intense at the formation of the finishing layer 10 with the result that cracking of the finishing layer 10 may occur and that the workability at the layer formation is lowered. The thickness of the finishing layer 10 is preferred to range from 0.8 to 1.5 $\mu$m.

The thickness of the Ti layer 9 formed under the finishing layer 10 is set at 0.2 to 1.0 $\mu$m. When this thickness is smaller than 0.2 $\mu$m, the adhesion between the finishing layer 10 and the Sn—Cu—Pd alloy plate layer 3 is likely to lower. On the other hand, when the thickness of the Ti layer 9 is larger than 1.0 $\mu$m, not only does the above effect of enhancing the adhesion remain unchanged but also the workability at the layer formation is lowered. The thickness of the Ti layer 9 is preferred to range from 0.4 to 0.8 $\mu$m.

Both the finishing layer 10 and the Ti layer 9 are formed according to the dry plating technique. The dry plating technique suitably employed is, for example, the ion plating, sputtering or vacuum evaporation technique. In the formation of the finishing layer 10 with black gloss, suitable use is made of the method disclosed in Japanese Patent Laid-open Publication No. 63(1988)-161158.

The above description concerns the decorative members whose respective surfaces have white, golden and black glosses. In the present invention, a multi-colored decorative member whose surface has a combination of at least two gloss tones can be produced by combining them.

That is, a surface having the tone of the finishing layer mixed with a different tone can be produced by forming on the Sn—Cu—Pd alloy plate layer 3 a finishing layer composed of a layer of any of Pd, Rh and Pt (all white), a layer of any of Au and an Au alloy (both golden) or a layer of TiNCO (black) and by subsequently forming a layer (for example, a layer of Pd, Rh or Pt, a layer of Au or an Au alloy or a layer of TiNCO) covering part of a surface of this finishing layer, which has a tone different from that of the finishing layer.

Of the multicolored decorative member varieties according to the present invention, for example, a decorative member E1 having a surface with two colors of white and golden glosses will be described below with reference to FIG. 7.

This decorative member E1 is obtained by forming a pattern 5a of an Au plate layer or Au alloy plate layer so as to cover part of the surface of the finishing plate layer 4 of the white decorative member A shown in FIG. 1.

Figure 8:
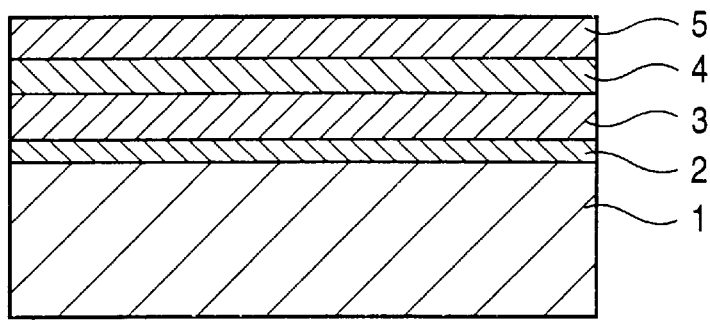
FIG. 8 is a sectional view showing the state of white decorative member A of FIG. 1 having a plate layer of Au or Au alloy formed on its surface.

In the production of this decorative member E1, first, an Au or Au alloy plate layer 5 is formed so as to cover the entire surface of the finishing plate layer 4 of the white decorative member A shown in FIG. 1 (see FIG. 8).

Figure 9:
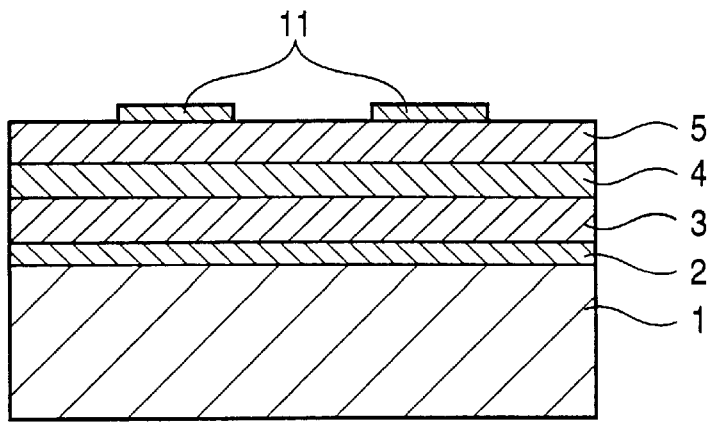
FIG. 9 is a sectional view showing the state of plate layer of FIG. 8 having a pattern mask formed thereon.
Figure 10:
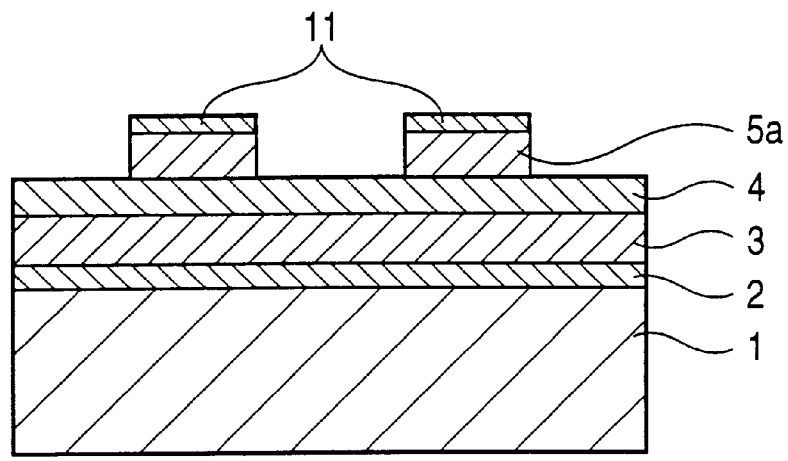
FIG. 10 is a sectional view showing the state of plate layer having been removed at area other than that in which the pattern mask has been formed in FIG. 9.

Subsequently, referring to FIG. 9, a mask pattern 11 is formed on areas intended to be left intact of the surface of the plate layer 5 by the customary printing such as screen, pad or offset printing, brushing or photoengraving. Thereafter, the member of FIG. 9 is immersed in a cyanide-based Au stripping solution to thereby dissolve away the plate layer 5 at the areas other than the above areas covered by the mask pattern 11. Thus, referring to FIG. 10, the plate layer 5 at the areas covered by the mask pattern 11 of preselected pattern remains on the plate layer 4 with white gloss.

Figure 7:
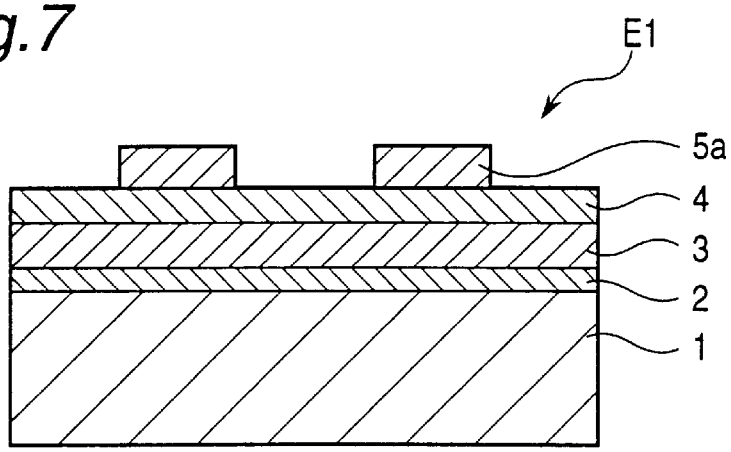
FIG. 7 is a sectional view of the layer structure of multicolored decorative member E1 according to the present invention.

Thereafter, the mask pattern 11 is peeled off, thereby obtaining the decorative member E1 with two colors of white and gold shown in FIG. 7.

Figure 11:
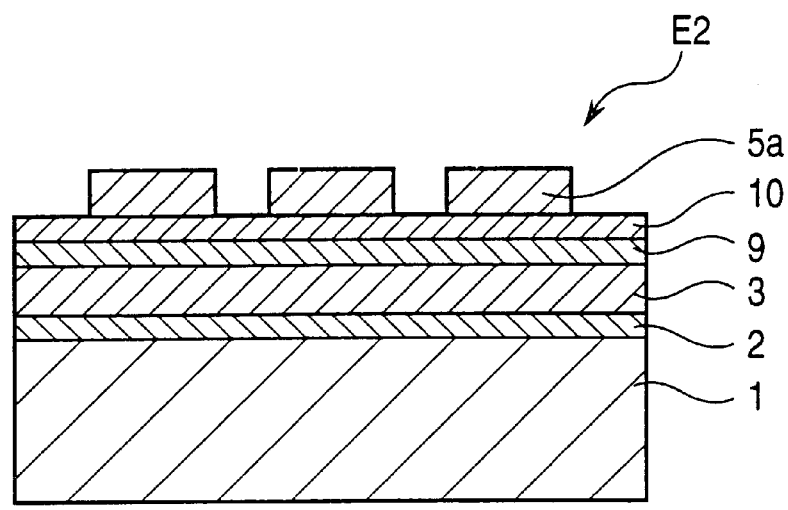
FIG. 11 is a sectional view of the layer structure of another multicolored decorative member E2 according to the present invention.

FIG. 11 is a sectional view of another bicolored decorative member E2. In this bicolored decorative member E2, a pattern 5a of golden plate layer is formed on the finishing layer 10 of the black decorative member D of FIG. 6 in the same manner as mentioned above with respect to the decorative member E1. Thus, this decorative member E2 is a decorative member with two colors of black and gold having a golden pattern formed on the surface with black gloss.

EXAMPLE

Example 1

Layers were formed on a surface of a watch case of brass in the following manner, thereby obtaining a white decorative member having the layer structure of FIG. 1.

(1) Formation of Primary Plate Layer 2

| Composition of plating bath: | |
|---|---|
| $Na_2SnO_3 \cdot 3H_2O$ | 60 g/lit., |
| CuCN | 20 g/lit., |
| $K_2SO_3H$ | 10 g/lit., |
| KCN (free) | 30 g/lit., |
| KOH | 60 g/lit., |
| $Zn(CN)_2$ | 5 g/lit. |
| Plating conditions: | |
| bath temperature | 50° C., |
| current density | 2.4 A/dm$^2$, |
| pH | 12.5, |
| deposition rate | 0.33 $\mu$m/min, and |
| time | 10 min. |

A Cu—Sn—Zn alloy plate layer 2 having a thickness of about 3 $\mu$m was formed on the surface of the watch case.

(2) Formation of Sn—Cu—Pd Alloy Plate Layer

An Sn—Cu—Pd alloy plate layer 3 was formed on the Cu—Sn—Zn alloy plate layer 2 under the following conditions.

| Composition of plating bath: | |
| --- | --- |
| Na$_2$SnO$_3$ · 3H$_2$O (26.7 g/lit. in terms of Sn), | 60 g/lit. |
| CuCN (14.2 g/lit. in terms of Cu), | 20 g/lit. |
| K$_2$SO$_3$H | 10 g/lit., |
| KCN (free) | 30 g/lit., |
| KOH | 60 g/lit., |
| K$_2$Pd(CN)$_4$.3H$_2$O (9.3 g/lit. in terms of Pd). | 30 g/lit. |
| Plating conditions: | |
| bath temperature | 50 to 55° C., |
| current density | 2.0 A/dm$^2$, |
| current efficiency | 47.8%, |
| pH | 12.5 to 13, |
| deposition rate | 0.33 μm/min, and |
| time | 9 min. |

A plate layer of about 3 μm in thickness, about 300 in hardness (Hv) and 9.6 g/cm$^3$ in density was formed. A simple quantitative analysis of the composition of this plate layer was carried out by the use of a scanning electron micrograph and an X-ray microanalyzer, and it was found that the plate layer was composed of a ternary alloy consisting of 17.12% by weight of Sn, 44.22% by weight of Cu and 38.66% by weight of Pd.

(3) Formation of Finishing Plate Layer 4

A plate layer 4 was formed on the Sn—Cu—Pd alloy plate layer 3 under the following conditions. Plating bath: Pallabright-SSS (trade name) produced by Japan Pure Chemical Co., Ltd.

| Plating conditions: | |
| --- | --- |
| bath temperature | 55° C., |
| current density | 1.5 A/dm$^2$, |
| pH | 7.6, |
| deposition rate | 0.33 μm/min, and |
| time | 6 min. |

A Pd plate layer 4 with white gloss having a thickness of about 2 μm was formed.

The thus obtained watch case with white gloss (white decorative member) was immersed in an artificial sweat (40° C.) containing 9.9 g/lit. of sodium chloride, 0.8 g/lit. of sodium sulfide, 7.1 g/lit. of urea, 0.19 ml/lit. of aqueous ammonia, 0.2 g/lit. of saccharose and 0.8 ml/lit. of lactic acid (50%) for 24 hr.

No surface discoloration occurred, thereby attesting to excellent corrosion resistance.

Further, this watch case with white gloss was subjected to a heating test in which it was allowed to stand still at 200° C. for 5 hr. No plate peeling was observed.

Example 2

Layers were formed on a surface of a watch case of brass in the following manner, thereby obtaining a golden decorative member having the layer structure B of FIG. 2.

A primary plate layer 2 and an Sn—Cu—Pd alloy plate layer 3 were formed in the same manner as in Example 1.

A plating bath of 4.0 in pH containing 10 g/lit. of Au, 0.3 g/lit. of Pt, 100 g/lit. of citric acid and 50 g/lit. of sodium citrate was prepared, and a wet plating was performed for 15 min under conditions such that the bath temperature was 40° C. and the current density was 1.0 A/dm$^2$. Thus, an Au—Pt alloy plate layer 5 having a thickness of 3.6 μm was formed on the above Sn—Cu—Pd alloy plate layer 3.

The resultant watch case with golden gloss (golden decorative member) exhibited substantially the same corrosion resistance and heat resistance as in Example 1.

Example 3

Layers were formed on a surface of a watch case of brass in the following manner, thereby obtaining a golden decorative member having the layer structure B' of FIG. 3.

First, a primary plate layer 2 was formed under the same conditions as in Example 1. An Sn—Cu—Pd alloy plate layer 3 having a thickness of 2.5 μm was formed thereon under the same conditions as in Example 1, except that the plating time was 7.5 min. Further, a Pd plate layer 6 having a thickness of 0.5 μm was formed thereon under the same conditions as in the formation of finishing plate layer of Example 1, except that the plating time was 1 min. Finally, an Au—Pt alloy plate layer 5 was formed on the Pd plate layer 6 under the same conditions as in Example 2.

The resultant watch case with golden gloss (golden decorative member) exhibited substantially the same corrosion resistance and heat resistance as in Example 1.

Example 4

A primary plate layer 2 and an Sn—Cu—Pd alloy plate layer 3 were sequentially formed on a surface of a watch case of brass under the same conditions as in Example 1. Thereafter, a TiN layer 7 and a finishing layer 8 were formed on the Sn—Cu—Pd alloy plate layer 3 under the following conditions, thereby obtaining a golden decorative member having the layer structure C of FIG. 4.

The member having the Sn—Cu—Pd alloy plate layer 3 formed was set in an ion plating apparatus. The interior of the apparatus was evacuated and Ar gas was introduced thereinto so that the degree of vacuum of the apparatus was $1.0 \times 10^{-3}$ Torr.

Then, a thermionic filament and a plasma electrode arranged in the apparatus were operated to generate Ar plasma. An ion bombardment cleaning was performed for 10 min on the surface of the Sn—Cu—Pd alloy plate layer 3.

Thereafter, N$_2$ gas was introduced into the apparatus so as to maintain the degree of vacuum in the apparatus at $2.0 \times 10^{-3}$ Torr. While operating a plasma gun disposed in the apparatus to generate plasma, Ti was evaporated for 10 min, thereby forming a 0.5 μm thick TiN layer 7 on the above Sn—Cu—Pd alloy plate layer 3.

The evaporation of Ti and the introduction of N$_2$ gas were terminated. An Au—Fe alloy containing 6% by weight of Fe was evaporated, so that a 0.3 μm thick Au—Fe alloy plate layer 8 was formed on the above TIN layer 7.

The thus obtained watch case with golden gloss (golden decorative member) had a uniform specified golden tone satisfying color 1N-14 defined in the Swiss Gold Plating Color Standards and the tone measured by a color difference meter was L*80, a*1.0, b*15.0.

A 24 hr corrosion resistance test was conducted for the watch case with the use of the same artificial sweat as in Example 1. No corrosion and discoloration were observed.

Moreover, an Ni reaction detecting test was conducted by wiping the watch case with a gauze impregnated with a dimethylglyoxime alcohol solution. No red coloration occurred and no free Ni was detected.

Example 5

An Sn—Cu—Pd alloy plate layer 3 was formed in the same manner as in Example 4, and the thickness thereof was caused to be the same 2.5 μm as in Example 3. A 0.5 μm thick Pd plate layer 6 was formed thereon under the same conditions as in Example 3. A 0.5 μm thick TiN layer 7 and a 0.3 μm thick Au—Fe alloy plate layer 8 were sequentially formed on the above Pd plate layer 6 in the same manner as in Example 4. Thus, a golden decorative member having the layer structure C' of FIG. 5 was produced.

A 48 hr corrosion resistance test was conducted for the above watch case having golden gloss with the use of the same artificial sweat as in Example 1. No corrosion and discoloration were observed.

Example 6

A primary plate layer 2 and an Sn—Cu—Pd alloy plate layer 3 were sequentially formed on a surface of a watch case of brass under the same conditions as in Example 1. Thereafter, a Ti layer 9 and a finishing layer of TiNCO 10 were formed on the Sn—Cu—Pd alloy plate layer 3 under the following conditions, thereby obtaining a black decorative member D having the layer structure of FIG. 6.

The member having the Sn—Cu—Pd alloy plate layer 3 formed was set in a bell-jar of an ion plating apparatus. The interior of the bell-jar was evacuated and Ar gas was introduced thereinto so that the degree of vacuum of the bell-jar was in the range of $5 \times 10^{-4}$ to $1 \times 10^{-2}$ Torr.

Then, a thermionic filament and a plasma electrode arranged in the apparatus were operated to generate Ar plasma. An ion bombardment cleaning was performed for about 10 min on the surface of the Sn—Cu—Pd alloy plate layer 3.

Subsequently, the degree of vacuum of the bell-jar was adjusted so as to fall in the range of $3 \times 10^{-4}$ to $1 \times 10^{-2}$ Torr, and metallic Ti as a vapor source was irradiated with electron beam generated by a plasma gun disposed in the apparatus. The resultant Ti vapor and Ar gas were ionized in the plasma and an accelerating voltage of negative potential 50 to 200 V was applied to the member. Thus, a Ti layer 9 of 0.5 μm in thickness was formed on the Sn—Cu—Pd alloy plate layer 3.

Thereafter, a mixture of $N_2$ gas and Ar gas containing 0.1 to 5.0% by volume of $O_2$ and 0.1 to 2.0% by volume of CO was introduced in the bell-jar and feed/exhaust control was effected so that the degree of vacuum of the bell-jar was maintained at $5 \times 10^{-3}$ Torr.

Metallic Ti was irradiated with electron beam generated by the plasma gun to thereby produce Ti vapor and, simultaneously, a direct current voltage of 50 V was applied between the metallic Ti as a positive electrode and the member as a negative electrode so as to pass an ionic current of SA for about 30 min.

Thus, a black finishing layer 10 of TiNCO having a thickness of about 1 μm was formed on the Ti layer 9.

The obtained watch case (black decorative member) had a surface with glossy black tone and exhibited the same corrosion resistance and heat resistance as had by the white decorative member of Example 1. A 90° bending test was conducted. No peeling of the black finishing layer was observed at the surface, attesting to excellent adhesion with the substrate.

Example 7

A primary plate layer 2 and an Sn—Cu—Pd alloy plate layer 3 were sequentially formed on a surface of a watch case of brass under the same conditions as in Example 1. Thereafter, a finishing plate layer 4 of Rh was formed on the Sn—Cu—Pd alloy plate layer 3 and a partial finishing plate layer of Au—Pt alloy 5 was formed thereon in the following manner, thereby obtaining a multicolored decorative member having the layer structure of FIG. 7.

The surface of the member having the Sn—Cu—Pd alloy plate layer 3 formed was subjected to a wet plating under the following conditions:

| plating bath composition: | 2 g/lit. of Rh and 38 ml/lit. of $H_2SO_4$, |
|---|---|
| bath temperature: | 40° C., and |
| current density: | 1 A/dm². |

Thus, a finishing plate layer 4 composed of Rh and having a thickness of 1.5 μm was formed. This finishing plate layer 4 had deep white gloss, had a hardness of 850 in Hv and was excellent in abrasion resistance.

A 2.5 μm thick Au—Pt alloy plate layer 5 was formed on the finishing plate layer 4 under the same conditions as in Example 2 (see FIG. 8).

A mask ink of an epoxy resin was screen printed on areas intended to be left intact of the surface of the Au—Pt alloy plate layer 5, thereby forming a pattern mask 11 as shown in FIG. 9. The whole was immersed in a cyanide-based Au stripping solution to thereby dissolve away the Au—Pt alloy plate layer at the areas other than the above areas covered by the pattern mask 11.

The pattern mask was peeled off by immersing the whole in a peeling solution composed of a mixture of a chlorinated hydrocarbon solvent, an alcohol, a nonionic surfactant and paraffin wax.

The resultant watch case of two colors of white and gold (multicolored decorative member) had the pattern Sa of partial finishing plate layer with golden tone drawn on part of the surface of the finishing plate layer 4 with deep white tone, thereby exerting a decorative effect enabling rich designs. Further, this multicolored decorative member had the same corrosion resistance and heat resistance as had by the white member of Example 1.

When it is desired to enlarge the area of the partial finishing plate layer with golden tone on this multicolored decorative member, a suitable process comprises forming a finishing plate layer 4 with white tone, forming a pattern mask at areas of the finishing plate layer 4 where it is desired to leave the white tone while forming a partial finishing plate layer 5 golden tone at the other areas and finally peeling the pattern mask off.

Example 8

Figure 6:
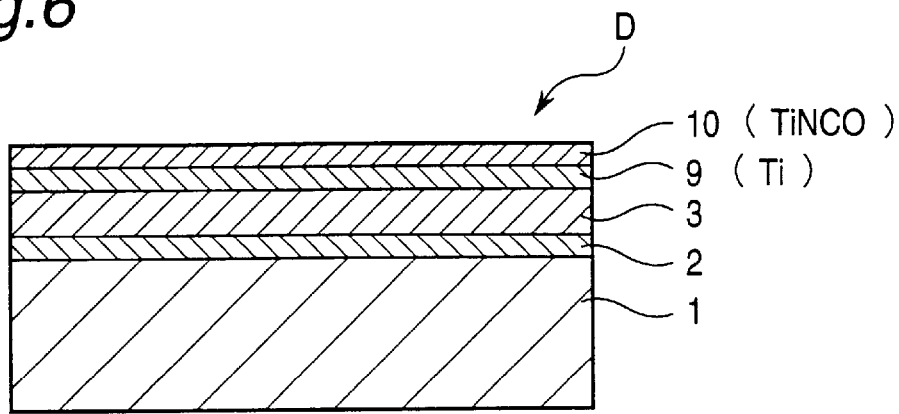
FIG. 6 is a sectional view of the layer structure of black decorative member D according to the present invention.

A primary plate layer 2, an Sn—Cu—Pd alloy plate layer 3, a Ti layer 9 and a finishing layer of TiNCO 10 were sequentially formed on a surface of a watch case of brass under the same conditions as in Example 6, thereby obtaining a black decorative member D having the layer structure of FIG. 6. Thereafter, a pattern of partial finishing plate layer of Au—Pt alloy with golden tone was formed on the black finishing layer 10 of the black decorative member D in the same manner as in Example 7, thereby obtaining a multicolored decorative member having the layer structure of FIG. 11.

The resultant watch case of two colors of black and gold (multicolored decorative member) had the pattern of partial finishing plate layer with golden drawn on part of the surface of the finishing layer with glossy black tone, thereby exerting a fine decorative effect as a whole. Further, this multicolored decorative member had substantially the same corrosion resistance, heat resistance and adhesion as had by the black decorative member of Example 6.

When it is desired to enlarge the area of the partial finishing plate layer with golden tone on this multicolored decorative member, a suitable process comprises the formation of a finishing plate layer with black tone, the formation of a pattern mask at areas of the finishing plate layer where it is desired to leave the black tone while forming a partial finishing plate layer with golden tone at the other areas and finally peeling the pattern mask off.

This multicolored decorative member can also be produced by the following process.

That is, first, a golden decorative member having the layer structure of FIG. 2 is produced. A finishing layer of TiNCO is formed on the surface of the finishing plate layer 5 thereof. The surface of areas intended to be left intact of this finishing layer is covered by a pattern mask. The whole is immersed in a 10 to 15% sodium hydroxide solution for a given period of time to thereby peel off the TiNCO at the areas other than those covered by the pattern mask. Finally, pattern mask is selectively peeled off by immersing the whole in a peeling solution composed of a mixture of a chlorinated hydrocarbon solvent, an alcohol, a nonionic surfactant and paraffin wax.

EFFECT OF THE INVENTION

As apparent from the foregoing description, dissolution of free Ni does not occur from the white decorative member comprising the substrate 1, the primary plate layer 2, the Sn—Cu—Pd alloy plate layer 3 and the finishing plate layer 4 because none of the constituent materials thereof contains Ni. Further, the interlayer adhesion between plate layers is excellent, so that no peeling phenomenon occurs in the heating test. Still further, the white decorative member has excellent corrosion resistance because of the action of the Sn—Cu—Pd alloy plate layer.

Dissolution of free Ni does not occur from both the first golden decorative member comprising the substrate 1, the primary plate layer 2, the Sn—Cu—Pd alloy plate layer 3 and the finishing plate layer 5 and the second golden decorative member comprising the substrate 1, the primary plate layer 2, the Sn—Cu—Pd alloy plate layer 3, the TiN layer 7 and the finishing layer 8 because none of the constituent materials thereof contains Ni.

Dissolution of free Ni does not occur from the black decorative member comprising the substrate 1, the primary plate layer 2, the Sn—Cu—Pd alloy plate layer 3, the Ti layer 9 and the finishing layer 10 because no Ni is contained therein. The outermost black finishing layer of TiNCO has a very high hardness and is excellent in abrasion resistance. Further, the outermost black finishing layer is strongly bonded with the Sn—Cu—Pd alloy plate layer by virtue of the action of the Ti layer. Therefore, the black decorative effect can be exerted for a prolonged period of time.

The multicolored decorative member comprising the (a) substrate 1, (b) the primary plate layer 2, (c) the Sn—Cu—Pd alloy plate layer 3, (d) the finishing layer composed of a material selected from the group consisting of Pd, Rh, Pt, Au, an Au alloy and TiNCO, and (e) the partial finishing layer covering part of a surface of the above finishing layer, which partial finishing layer is composed of a material different from that of the above finishing layer and has a tone different from that of the above finishing layer, has a surface with a tone of, for example, white/gold, white/black or black/gold and exerts a decorative effect enabling rich designs.

The second golden decorative member having both the Ti layer and the finishing layer formed according to the dry plating technique does not suffer from dissolution of free Ni because none of the constituent materials thereof contains Ni. Moreover, this second golden decorative member has enhanced abrasion resistance as a whole and ensures a prolonged service life because the golden TiN layer of high abrasion resistance is formed according to the dry plating technique between the outermost golden layer formed according to the dry plating technique and the Sn—Cu—Pd alloy plate layer.

The first golden decorative member having the Pd plate layer interposed between the Sn—Cu—Pd alloy plate layer 3 and the finishing plate layer 5 and the second golden decorative member having the Pd plate layer interposed between the Sn—Cu—Pd alloy plate layer 3 and the TiN layer 7 both exhibit further enhanced interlayer adhesion between plate layers.

The decorative members of the present invention are highly useful as decorative members of white, gold and black or a tone of a combination of these which do not induce Ni allergy.

We claim:

1. A white decorative member comprising:

a substrate;

a primary plate layer having a thickness of at least 1 µm and covering a surface of the substrate, said primary plate layer being composed of a Cu plate layer or Cu alloy plate layer;

an Sn—Cu—Pd alloy plate layer having a thickness of at least 0.2 µm and covering a surface of the primary plate layer, said Sn—Cu—Pd alloy plate layer comprising 10 to 20% by weight of Sn, 10 to 80% by weight of Cu and 10 to 50% by weight of Pd as essential components; and a finishing plate layer having a thickness of 0.2 to 5 µm and covering the Sn—Cu—Pd alloy plate layer, said finishing plate layer being composed of at least one element selected from the group consisting of Pd, Rh and Pt.

2. The decorative member as claimed in claim 1, wherein said Cu alloy plate layer is composed of an alloy selected from the group consisting of Cu—Sn, Cu—Sn—Zn, Cu—Sn—Pb and Cu—Sn—Cd alloys.

3. The decorative member as claimed in claim 2, wherein said Cu alloy plate layer is composed of an alloy comprising 20 to 40% by weight of Sn, 1 to 10% by weight of Zn and a balance of Cu.

4. A golden decorative member comprising:

a substrate;

a primary plate layer having a thickness of at least 1 µm and covering a surface of the substrate, said primary plate layer being composed of a Cu plate layer or Cu alloy plate layer;

an Sn—Cu—Pd alloy plate layer having a thickness of at least 0.2 µm and covering a surface of the primary plate layer, said Sn—Cu—Pd alloy plate layer comprising 10 to 20% by weight of Sn, 10 to 80% by weight of Cu and 10 to 50% by weight of Pd as essential components; and a finishing plate layer having a thickness of 0.2 to 5 µm and covering the Sn—Cu—Pd alloy plate layer, said finishing plate layer being composed of an Au plate layer or an Au alloy plate layer which does not contain Ni.

5. The decorative member as claimed in claim 4, wherein said Cu alloy plate layer is composed of an alloy selected from the group consisting of Cu—Sn, Cu—Sn—Zn, Cu—Sn—Pb and Cu—Sn—Cd alloys.

6. The decorative member as claimed in claim 5, wherein said Cu alloy plate layer is composed of an alloy comprising 20 to 40% by weight of Sn, 1 to 10% by weight of Zn and a balance of Cu.

7. The golden decorative member as claimed in claim 4, wherein a Pd plate layer is interposed between the Sn—Cu—Pd alloy plate layer and the finishing plate layer.

8. The golden decorative member as claimed in claim 7, wherein said Pd plate layer is formed by a wet plating process.

9. A golden decorative member comprising:
a substrate;
a primary plate layer having a thickness of at least 1 μm and covering a surface of the substrate, said primary plate layer being composed of a Cu plate layer or Cu alloy plate layer;
an Sn—Cu—Pd alloy plate layer having a thickness of at least 0.2 μm and covering a surface of the primary plate layer, said Sn—Cu—Pd alloy plate layer comprising 10 to 20% by weight of Sn, 10 to 80% by weight of Cu and 10 to 50% by weight of Pd as essential components;
a TiN layer having a thickness of 0.1 to 10 μm and covering a surface of the Sn—Cu—Pd alloy plate layer; and
a finishing plate layer having a thickness of 0.05 to 0.5 μm and covering the TiN layer, said finishing layer being composed of Au alone or an Au alloy which does not contain Ni.

10. The decorative member as claimed in claim 9, wherein said Cu alloy plate layer is composed of an alloy selected from the group consisting of Cu—Sn, Cu—Sn—Zn, Cu—Sn—Pb and Cu—Sn—Cd alloys.

11. The decorative member as claimed in claim 10, wherein said Cu alloy plate layer is composed of an alloy comprising 20 to 40% by weight of Sn, 1 to 10% by weight of Zn and a balance of Cu.

12. The golden decorative member as claimed in claim 9, wherein a Pd plate layer is interposed between the Sn—Cu—Pd alloy plate layer and the TiN layer.

13. The golden decorative member as claimed in claim 12, wherein said Pd plate layer is formed by a wet plating process.

14. The golden decorative member as claimed in claim 9, wherein both the TiN layer and the finishing layer are formed by a dry plating process.

15. A black decorative member comprising:
a substrate;
a primary plate layer having a thickness of at least 1 μm and covering a surface of the substrate, said primary plate layer being composed of a Cu plate layer or Cu alloy plate layer;
an Sn—Cu—Pd alloy plate layer having a thickness of at least 0.2 μm and covering a surface of the primary plate layer, said Sn—Cu—Pd alloy plate layer comprising 10 to 20% by weight of Sn, 10 to 80% by weight of Cu and 10 to 50% by weight of Pd as essential components;
a Ti layer having a thickness of 0.2 to 1.0 μm and covering a surface of the Sn—Cu—Pd alloy plate layer; and
a finishing layer having a thickness of 0.5 to 2.0 μm and covering the Ti layer, said finishing layer being composed of TiNCO.

16. The decorative member as claimed in claim 15, wherein said Cu alloy plate layer is composed of an alloy selected from the group consisting of Cu—Sn, Cu—Sn—Zn, Cu—Sn—Pb and Cu—Sn—Cd alloys.

17. The decorative member as claimed in claim 16, wherein said Cu alloy plate layer is composed of an alloy comprising 20 to 40% by weight of Sn, 1 to 10% by weight of Zn and a balance of Cu.

18. The black decorative member as claimed in claim 14, wherein both the Ti layer and the finishing layer are formed by a dry plating process.

19. A multicolored decorative member comprising:
a substrate;
a primary plate layer having a thickness of at least 1 μm and covering a surface of the substrate, said primary plate layer being composed of a Cu plate layer or Cu alloy plate layer;
an Sn—Cu—Pd alloy plate layer having a thickness of at least 0.2 μm and covering a surface of the primary plate layer, said Sn—Cu—Pd alloy plate layer comprising 10 to 20% by weight of Sn, 10 to 80% by weight of Cu and 10 to 50% by weight of Pd as essential components;
a finishing layer having a thickness of 0.2 to 5.0 μm and covering a surface of the Sn—Cu—Pd alloy plate layer, said finishing layer being composed of a material selected from the group consisting of Pd, Rh, Pt, Au, an Au alloy and TiNCO; and
a partial finishing layer covering part of a surface of the finishing layer, said partial finishing layer being composed of a material which is different from that of the finishing layer and having a tone which is different from that of the finishing layer.

20. The decorative member as claimed in claim 19, wherein said Cu alloy plate layer is composed of an alloy selected from the group consisting of Cu—Sn, Cu—Sn—Zn, Cu—Sn—Pb and Cu—Sn—Cd alloys.

21. The decorative member as claimed in claim 20, wherein said Cu alloy plate layer is composed of an alloy comprising 20 to 40% by weight of Sn, 1 to 10% by weight of Zn and a balance of Cu.

* * * * *

UNITED STATES PATENT AND TRADEMARK OFFICE
CERTIFICATE OF CORRECTION

PATENT NO. : 5,972,526
DATED : October 26, 1999
INVENTOR(S) : Yosuke Matsumoto et al.

It is certified that error appears in the above-identified patent and that said Letters Patent is hereby corrected as shown below:

Column 1 line 27 "a Ni" should read --an Ni--.

Column 3 line 58 "10 µm" should read --1.0 µm--.

Column 13 line 51 "SA" should read --5A--.

Column 14 line 34 "pattern Sa" should read --pattern 5a--.

Signed and Sealed this

Twenty-third Day of May, 2000

Attest:

Q. TODD DICKINSON

*Attesting Officer*  *Director of Patents and Trademarks*